United States Patent
Chao et al.

(10) Patent No.: US 11,069,872 B2
(45) Date of Patent: Jul. 20, 2021

(54) DELOCALIZER AND LIGHT EMITTING DEVICE USING THE SAME

(71) Applicants: Ching-Yan Chao, Hsinchu (TW); Feng-Wen Yen, Taipei (TW)

(72) Inventors: Ching-Yan Chao, Hsinchu (TW); Feng-Wen Yen, Taipei (TW)

(73) Assignee: LUMINESCENCE TECHNOLOGY CORP., Hsin-Chu (TW)

( * ) Notice: Subject to any disclaimer, the term of this patent is extended or adjusted under 35 U.S.C. 154(b) by 0 days.

(21) Appl. No.: 16/231,949

(22) Filed: Dec. 25, 2018

(65) Prior Publication Data

US 2020/0176703 A1 Jun. 4, 2020

(30) Foreign Application Priority Data

Nov. 29, 2018 (TW) ................. 107142753

(51) Int. Cl.
*H01L 51/00* (2006.01)
*H01L 51/52* (2006.01)
*H01L 27/32* (2006.01)

(52) U.S. Cl.
CPC .. *H01L 51/5212* (2013.01); *H01L 2251/5392* (2013.01)

(58) Field of Classification Search
CPC ....... H01L 2251/5392; H01L 2251/329; H01L 51/5012; H01L 51/5203; H01L 51/5206; H01L 51/5209; H01L 51/5212; H01L 51/5215; H01L 51/5218; H01L 51/5225; H01L 51/5228; H01L 51/5234; H01L 51/5237; H01L 51/5253; H01L 27/3258; H01L 27/3262; H01L 27/3248; H01L 27/322; H01L 27/3276; H01L 27/329; H01L 51/0096; H01L 51/448; H01L 51/442; H01L 51/52; H01L 51/5262; H01L 51/5271; H01L 2251/308; H01L 2251/305; H01L 2251/50; H01L 2251/53; H01L 2251/5307; H01L 2251/558; H01L 27/32; H01L 27/3202; H01L 27/3204; H01L 2227/32; Y02E 10/549
USPC ...................... 257/40, 99; 438/105
See application file for complete search history.

(56) References Cited

U.S. PATENT DOCUMENTS

| | | | |
|---|---|---|---|
| 6,037,005 A * | 3/2000 | Moshrefzadeh | G02F 1/134336 216/101 |
| 9,825,249 B2 | 11/2017 | Lee et al. | |
| 2005/0156512 A1* | 7/2005 | Savvateev | H01L 51/5203 313/503 |
| 2007/0128765 A1* | 6/2007 | Auch | H01L 51/5246 438/105 |

(Continued)

*Primary Examiner* — Natalia A Gondarenko

(57) ABSTRACT

A delocalizer and a light emitting device using the same are provided. The light emitting device includes a substrate and a first electrode layer. The first electrode layer is disposed over the substrate, in which two sides of the first electrode layer have a first contact pad and a second contact pad, respectively. The delocalizer is disposed between the first contact pad and the second contact pad. The delocalizer may include a plurality of strip-shaped transparent conductive members adjacent to each other, and a plurality of transparent conductive blocks adjacent to each other may be disposed between adjacent two of the strip-shaped transparent conductive members.

19 Claims, 9 Drawing Sheets

(56) References Cited

U.S. PATENT DOCUMENTS

| | | | |
|---|---|---|---|
| 2008/0088227 A1* | 4/2008 | Lee | H01L 51/5212 |
| | | | 313/504 |
| 2013/0037827 A1* | 2/2013 | Levermore | H01L 27/3202 |
| | | | 257/88 |
| 2013/0270994 A1* | 10/2013 | Sakaguchi | H01L 51/5212 |
| | | | 313/504 |
| 2015/0014672 A1* | 1/2015 | Yamae | H05B 33/04 |
| | | | 257/40 |
| 2017/0077210 A1* | 3/2017 | Moon | H01L 27/3276 |
| 2017/0092891 A1* | 3/2017 | Tanaka | H01L 51/5228 |

\* cited by examiner

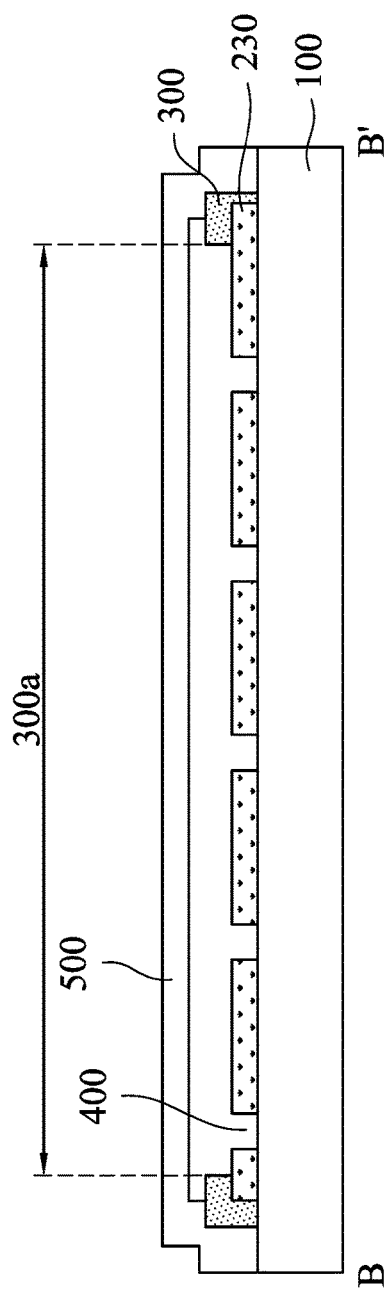
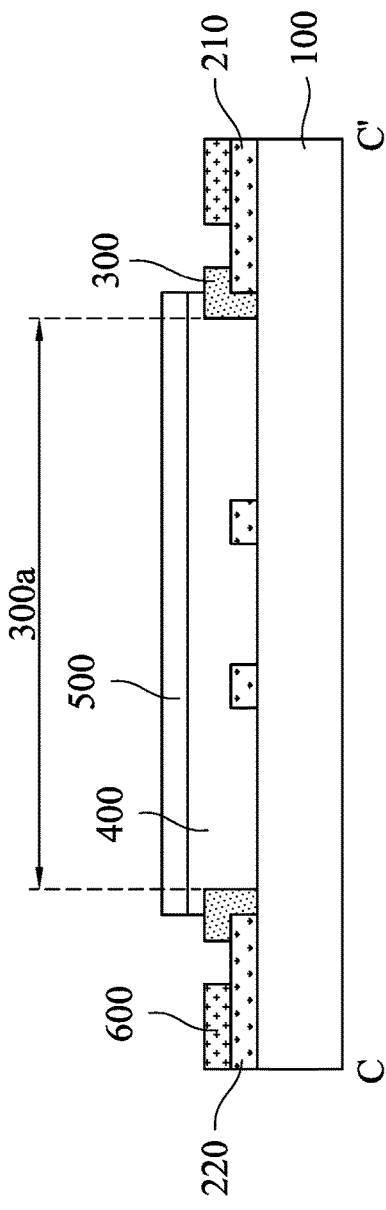

DELOCALIZER AND LIGHT EMITTING DEVICE USING THE SAME

CROSS-REFERENCE TO RELATED APPLICATION

This application claims priority to TW Application Serial Number 107142753, filed Nov. 29, 2018, which is herein incorporated by reference.

BACKGROUND

Field of Invention

The present disclosure relates to a light emitting device, and more particularly to a light emitting device using a delocalizer.

Description of Related Art

Generally, an organic light emitting diode device includes an anode, an organic light emitting layer, and a cathode. When the organic light emitting diode device is turned on, holes are injected from the anode and enter the organic light emitting layer, and electrons are injected from the cathode and enter the organic light emitting layer. Therefore, the electrons and the holes are recombined in the organic light emitting layer to generate excitons. The excitons then relax through the light emitting mechanism to emit light.

Generally, the organic light emitting diode device is fabricated by depositing the anode, the organic light emitting layer, and the cathode on a substrate, which are typically performed in a clean room. However, even in the clean room, it may have particle contamination. For example, the particles may cause a thickness of a certain region of the organic light emitting layer to become thin, or even cause the anode to be in direct contact with the cathode (hereinafter called as a short-circuit defect), thereby generating a current path with lower resistance. Accordingly, the current concentrates and flows to this region, causing a short circuit of the organic light emitting diode device. In more severe cases, the entire organic light emitting layer may not emit light.

U.S. Pat. No. 9,825,249 B2 disclosed that a patterned first electrode may be formed to avoid the above problems. As shown in FIG. 1A, the patterned first electrode includes a conductive unit 1, a conductive connector 2, an auxiliary electrode 3, and an insulating layer 4. The conductive connector 2 is configured to have an aspect ratio with a specific range so that it has a resistance value that can prevent the short-circuit defect. Specifically, when the short-circuit defect occurs at the conductive unit 1 (i.e., a current path having lower resistance here), the conductive connector 2 can prevent all driving current from flowing to the defective portion. That is, the conductive connector 2 can control an amount of leakage current so that the leakage current does not increase unlimitedly. Therefore, even if the short-circuit defect occurs at some of the conductive units 1, other conductive units 1 without the short-circuit defect can still operate normally.

In order to maintain brightness uniformity of the organic light emitting diode device, the above-mentioned patterned first electrode includes the auxiliary electrode 3 with lower resistance. However, this design makes the manufacturing cost of the organic light emitting diode device higher, and as shown in FIG. 1B, the appearance thereof is obviously grid-like. Further, since a size of the conductive unit 1 is visible to the naked eye, when the short-circuit defect occurs at some of the conductive units 1, a clear dark spot may be found in the appearance (as shown in FIG. 1B). In some cases, the short-circuit defect may cause the insulating layer 4 to be burned through, causing the second electrode to directly conduct with the auxiliary electrode 3, and consequently the entire organic light emitting diode device does not emit light.

SUMMARY

An aspect of the present disclosure provides a delocalizer for delocalizing a dark spot of a light emitting region of an organic light emitting layer. The delocalizer is non-grid-shaped, which may include a plurality of strip-shaped transparent conductive members adjacent to each other, and may further include a plurality of transparent conductive blocks adjacent to each other and electrically connected between adjacent two of the strip-shaped transparent conductive members. A short-circuit defect occurs at a position of the above-mentioned light emitting region, in which the delocalizer may be configured to delocalize the dark spot by gradually weakening the light emitted from the light emitting region toward the position. The organic light emitting layer is observed with the naked eye, the dark spot may not be seen, rather than that the entire light emitting region does not emit the light.

According to one embodiment of the present disclosure, the transparent conductive blocks electrically connected to two opposite sides of each of the strip-shaped transparent conductive members are staggered from each other in one direction.

Another aspect of the present disclosure provides a light emitting device using the delocalizer mentioned above including the organic light emitting layer. The light emitting device further includes an insulating layer covering the delocalizer, in which the insulating layer has an opening, in which the organic light emitting layer is filled in the opening; and a second electrode layer disposed over the organic light emitting layer.

According to one embodiment of the present disclosure, the light emitting device further includes a first contact pad and a second contact pad, in which the strip-shaped transparent conductive members are connected in series and between the first contact pad and the second contact pad.

According to one embodiment of the present disclosure, the light emitting device further includes a conductive layer disposed over the first contact pad and the second contact pad, in which the conductive layer is a silver paste layer, which is configured to reduce impedance in a current path through the first contact pad or the second contact pad.

According to one embodiment of the present disclosure, each of the strip-shaped transparent conductive members has at least one closed loop between the first contact pad and the second contact pad.

According to one embodiment of the present disclosure, the closed loop is connected to at least one of the transparent conductive blocks.

According to one embodiment of the present disclosure, each of the strip-shaped transparent conductive members is 8-shaped.

According to one embodiment of the present disclosure, each of the closed loops is diamond-shaped. The closed loops are electrically connected to each other.

The above description will be described in detail in the following embodiments, and further explanation of the technical solutions of the present disclosure is provided.

BRIEF DESCRIPTION OF THE DRAWINGS

The invention may be more fully understood by reading the following detailed description of the embodiment, with reference made to the accompanying drawings as follows:

FIG. 2B is a cross-sectional view of the light emitting device taken along line B-B' of FIG. 2A according to an embodiment of the present disclosure;

FIG. 2C is a cross-sectional view of the light emitting device taken along line C-C' of FIG. 2A according to an embodiment of the present disclosure;

DETAILED DESCRIPTION

In order that the present disclosure is described in detail and completeness, implementation aspects and specific embodiments of the present disclosure with illustrative description are presented; but it is not the only form for implementation or use of the specific embodiments. The embodiments disclosed herein may be combined or substituted with each other in an advantageous manner, and other embodiments may be added to an embodiment without further description. In the following description, numerous specific details will be described in detail in order to enable the reader to fully understand the following embodiments. However, the embodiments of the present disclosure may be practiced without these specific details.

Further, spatially relative terms, such as "beneath," "below," "lower," "over," "on," "upper" and the like, may be used herein for ease of description to describe one element or feature's relationship to another element(s) or feature(s) as illustrated in the figures. The true meaning of the spatially relative terms includes other orientations. For example, when the figure is flipped up and down by 180 degrees, the relationship between one component and another component may change from "beneath," "below," "lower," to "over," "on," "upper." In addition, the spatially relative descriptions used herein should be interpreted the same.

Figure 1A:
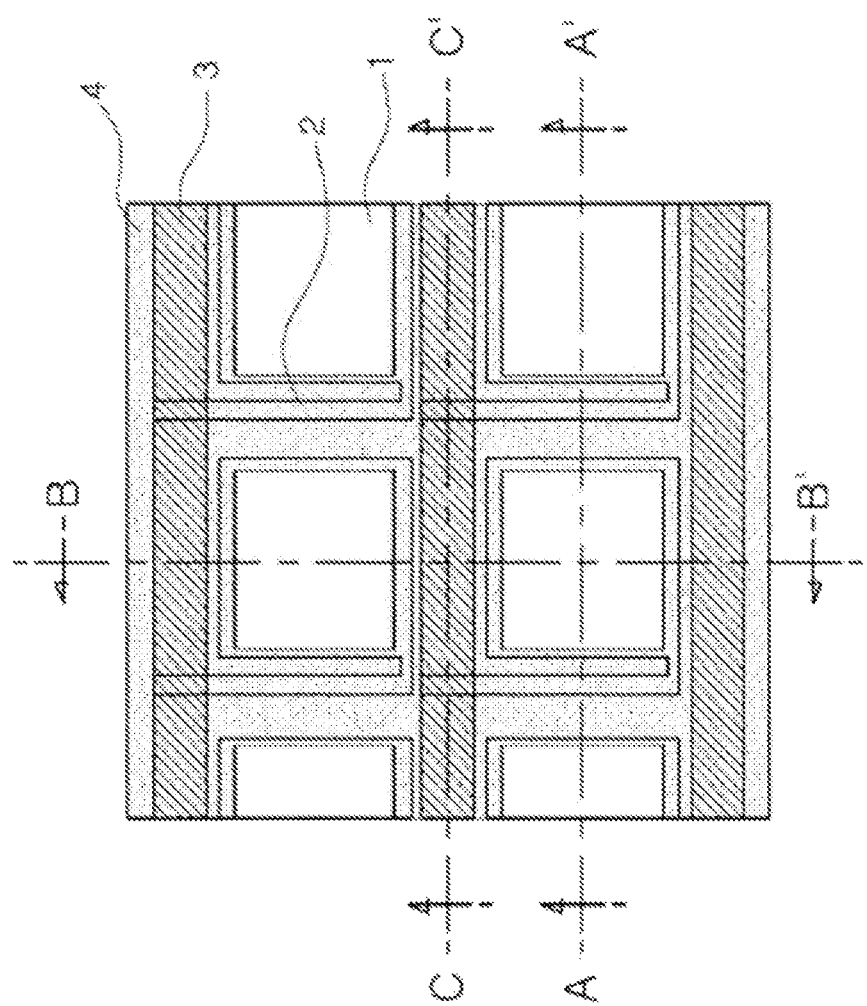
FIG. 1A is a top view of a first electrode of a conventional organic light emitting diode device.
Figure 1B:
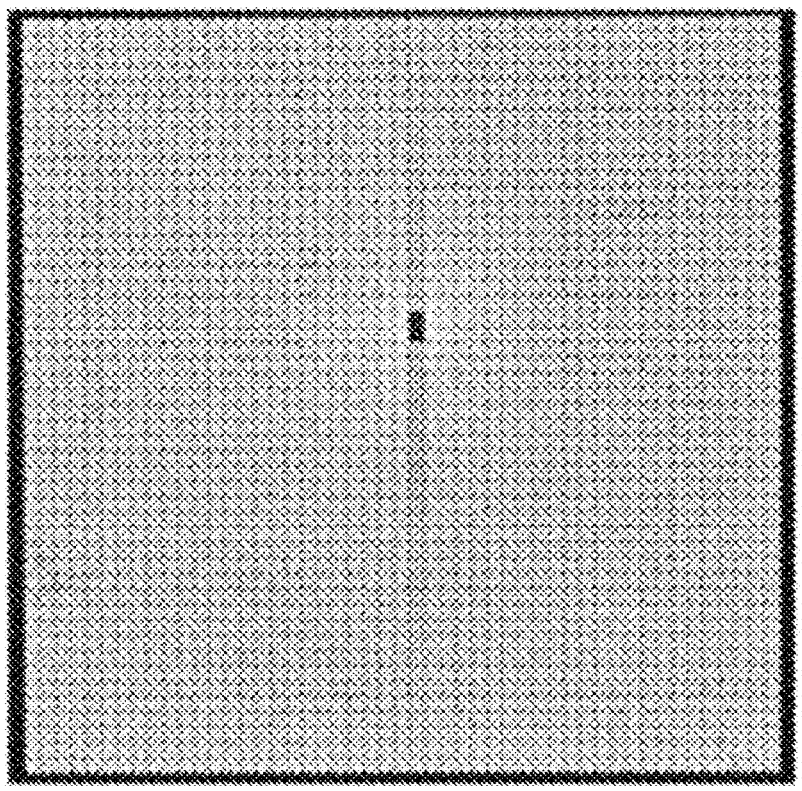
FIG. 1B is a top view of a light emitting state of a conventional organic light emitting diode device.
Figure 2A:
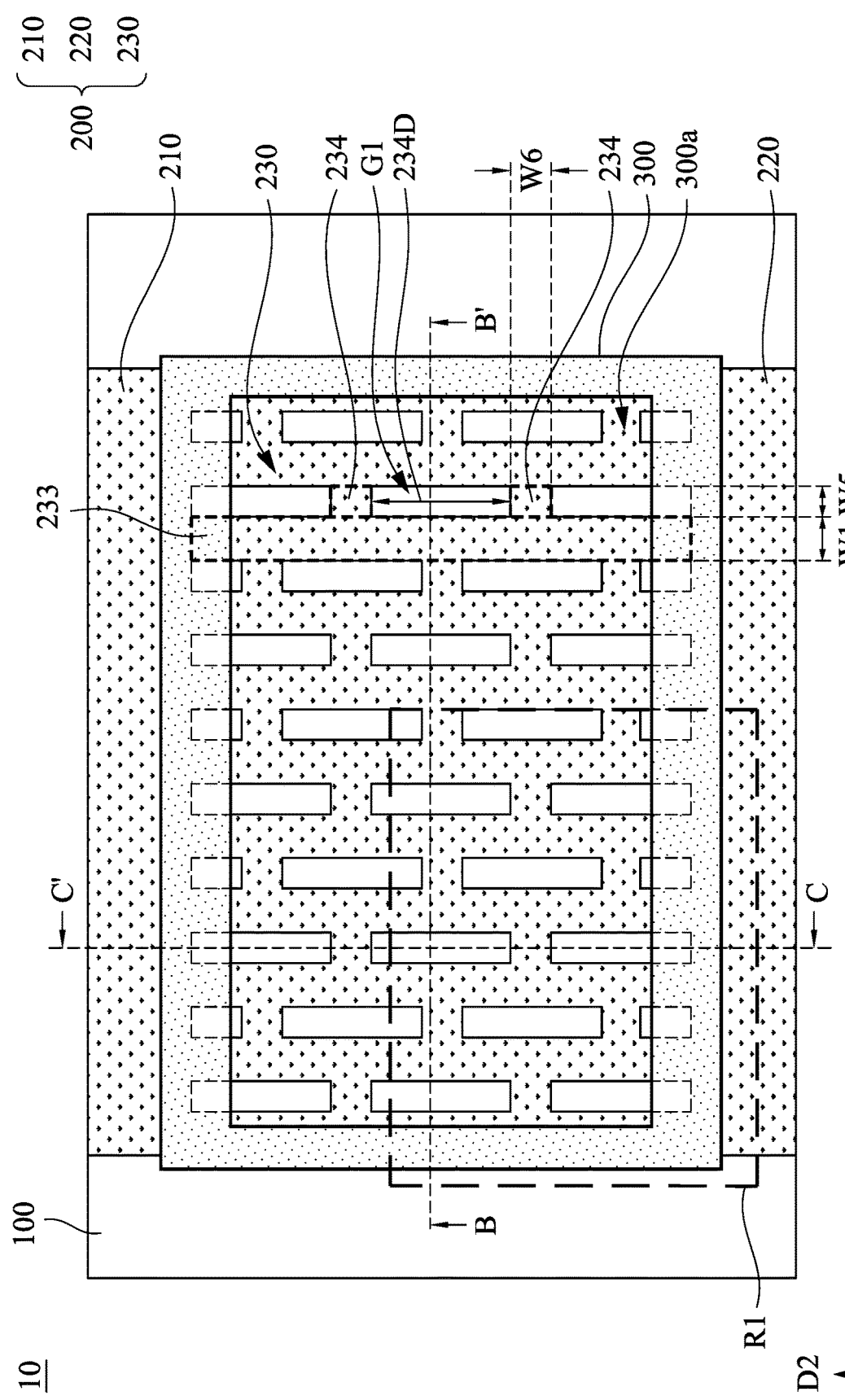
FIG. 2A is a top view of a light emitting device according to an embodiment of the disclosure.

Please simultaneously refer to FIG. 2A, FIG. 2B, and FIG. 2C. FIG. 2A is a top view of a light emitting device 10 according to an embodiment of the disclosure, and FIGS. 2B and 2C are cross-sectional views of the light emitting device 10 taken along line B-B' and line C-C' of FIG. 2A, respectively. As shown in FIGS. 2A, 2B, and 2C, the light emitting device 10 includes a substrate 100, a first electrode layer 200, an insulating layer 300, an organic light emitting layer 400, a second electrode layer 500, and a conductive layer 600. It should be noted that, for the sake of clarity, the organic light emitting layer 400, the second electrode layer 500, and the conductive layer 600 are omitted in FIG. 2A.

The substrate 100 is a substrate having excellent light transmittance. In some embodiments, the substrate 100 is, for example, a glass substrate, a resin substrate, or a plastic substrate. For example, the substrate 100 may be a polyethylene terephthalate (PET) substrate, a polyethylene naphthalate (PEN) substrate, a polyether ether ketone (PEEK) substrate, or a polyimide (PI) substrate, but not limited thereto.

The first electrode layer 200 is disposed over the substrate 100. Two sides of the first electrode layer 200 may have a first contact pad 210 and a second contact pad 220, respectively. There is no grid-shaped auxiliary electrode in the first electrode layer 200, but the first electrode layer 200 may further include a delocalizer 230. The delocalizer 230 may be a transparent conductive structure. The delocalizer 230 is non-grid-shaped, unlike the grid-shaped auxiliary electrode. In some embodiments, the first electrode layer 200 has a thickness in a range of 50 to 500 nanometers. Specifically, the first contact pad 210 and the second contact pad 220 extend along a first direction D1. The delocalizer 230 is disposed between the first contact pad 210 and the second contact pad 220. Specifically, the delocalizer 230 includes a plurality of strip-shaped transparent conductive members 233, and may further include a plurality of transparent conductive blocks 234 disposed between adjacent two of the strip-shaped transparent conductive members 233. The strip-shaped transparent conductive members 233 extend from the first contact pad 210 toward the second contact pad 220, and the transparent conductive block 234 is disposed between the adjacent two of the strip-shaped transparent conductive members 233. In addition, each of the transparent conductive blocks 234 bridges adjacent two of the strip-shaped transparent conductive members 233. In some embodiments, each of the strip-shaped transparent conductive members 233 are parallel to each other and extend along a second direction D2, in which the second direction D2 is perpendicular to the first direction D1. In some embodiments, each of the transparent conductive blocks 234 are parallel to each other and extend along the first direction D1.

According to various embodiments of the present disclosure, the first contact pad 210, the second contact pad 220, and the delocalizer 230 may be made of conductive oxides such as indium tin oxide (ITO) or indium zinc oxide (IZO).

In some embodiments, the strip-shaped transparent conductive member 233 has a second width W1 in a range of 10 to 50 microns, such as 15 microns, 20 microns, or 30 microns. In some embodiments, the transparent conductive block 234 has a width W6 in a range of 5 to 25 microns, such as 10 microns, 15 microns, or 20 microns. As shown in FIG. 2A, adjacent two of the transparent conductive blocks 234 are separated by a distance 234D, and the distance 234D is about 10 times or more of the second width W1 of the strip-shaped transparent conductive member 233. In some embodiments, the distance 234D is in a range of 200 to 2000 microns, such as 300 microns, 500 microns, or 1000 microns.

Figure 3:
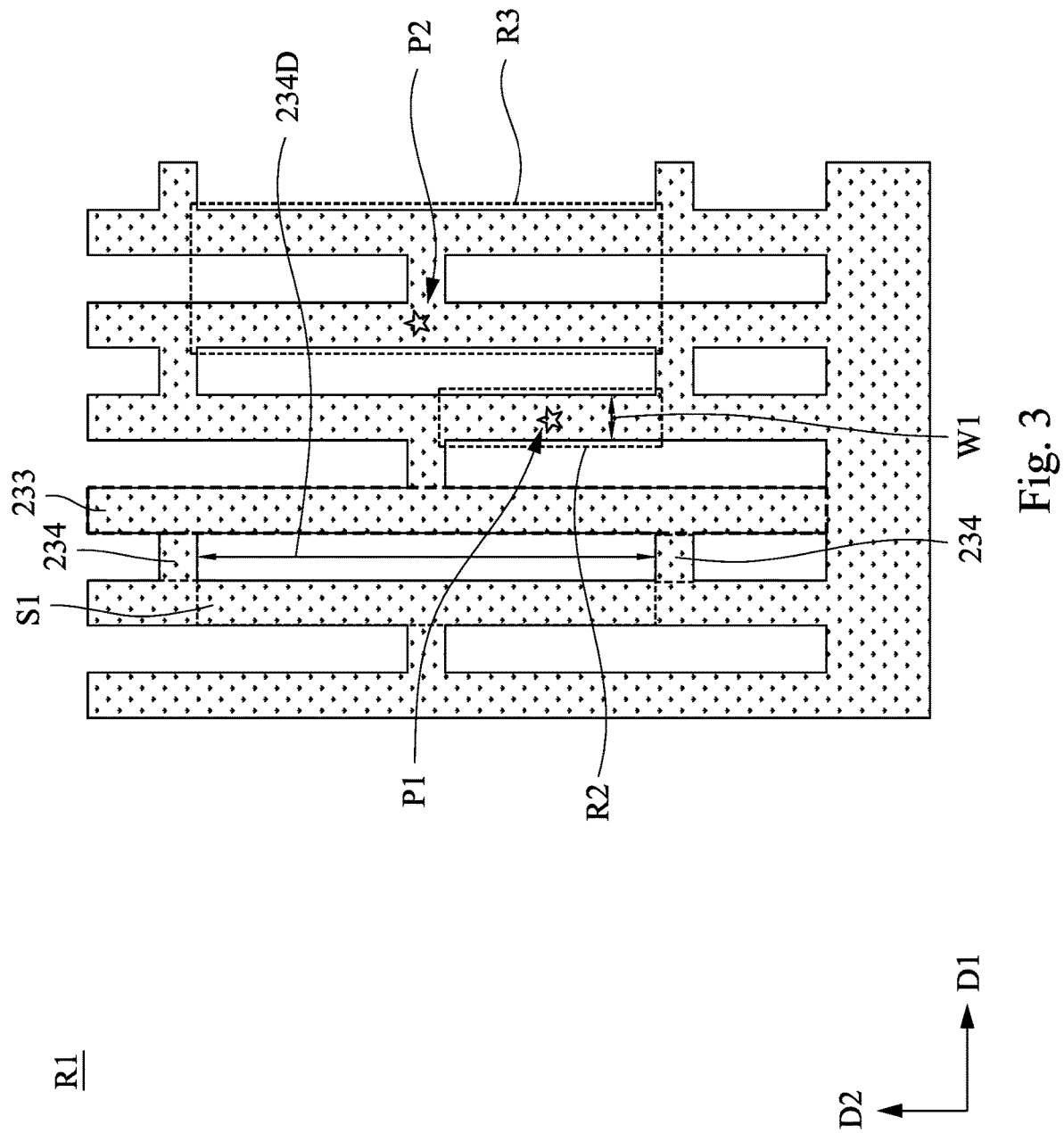
FIG. 3 is a partially enlarged view of a region of a light emitting device according to an embodiment of the present disclosure.

It should be noted that the distance 234D may be about 10 times or more of the second width W1, which may provide a specific technical effect, more preferably about 10 times to about 100 times. More specifically, referring to FIG. 3, which is a partially enlarged view of a region R1 of the light emitting device 10 of FIG. 2A. As shown in FIG. 3, the two adjacent transparent conductive blocks 234 define a section S1 of the strip-shaped transparent conductive member 233. Since the strip-shaped transparent conductive member 233 is composed of conductive oxides such as indium tin oxide or indium zinc oxide, when the distance 234D is about 10 times or more the second width W1, the section S1 has a resistance value that can prevent the short-circuit defect, more preferably about 10 times to about 100 times. Specifically, when the short-circuit defect occurs at the section S1 (i.e., a current path having lower resistance here), since the section S1 has the specific aspect ratio, a larger resistance value is provided to prevent all driving current from flowing to this defective portion. That is, an amount of leakage current can be controlled by adjusting the ratio of the distance 234D to the second width W1 so that the amount of leakage current does not become excessive, which will affect the operation of the device.

Continuously referring to FIG. 3, the organic light emitting layer 400 may have one light emitting region R2 and another light emitting region R3. For example, when the short-circuit defect occurs at the position P1 of the light emitting region R2, only the light emitting region R2 is affected by the short-circuit defect, and when the short-circuit defect occurs at the position P2 (i.e., the boundary between the strip-shaped transparent conductive member 233 and the transparent conductive block 234), only the light emitting region R3 is affected by the short-circuit defect. In detail, when the short-circuit defect occurs at the position P1, the light emitting region has a light emitted near the short-circuit defect. The delocalizer 230 may be configured to delocalize the dark spot by gradually weakening the emitted light near the short-circuit defect. The light emitted from the light emitting region R2 is gradually become weaker toward the position P1, rather than that the entire light emitting region R2 does not emit light. In other words, even if there is a dark spot at the light emitting region R2, the dark spot is delocalized by the delocalizer 230, so that when the organic light emitting layer 400 is observed with the naked eyes, the dark spot is not observed with the naked eyes. It is because sum of voltages across current paths (i.e., sum of the voltage across the first electrode layer 200, the voltage across from the first electrode layer 200 to the second electrode layer 500 through the organic light emitting layer 400, and the voltage across the second electrode layer 500) is the same, and thus when the short-circuit defect occurs at the position P1, the current concentrates and flows to the position P1 (i.e., the current increases). Accordingly, in the case that sum of the cross-voltages is constant, less cross-voltage is distributed to the organic light emitting layer 400 closer to the position P1, so that the emitting light is darker or it does not emit light. On the contrary, more cross-voltage is distributed to the organic light emitting layer 400 farther from the position P1, so that the emitting light is brighter.

Similarly, when the short-circuit defect occurs at the position P2, the delocalizer 230 can make the light emitted from the light emitting region R3 gradually become weaker toward the position P2, rather than that the entire light emitting region R3 does not emit light. In other words, even if there is a dark spot at the light emitting region R3, the dark spot is delocalized by the delocalizer 230, so that when the organic light emitting layer 400 is observed with the naked eye, the dark spot is not seen. As a result, when the short-circuit defect occurs, only a small region is affected, but there is no dark spot, and other regions can still operate normally. In addition, in the affected region, the light emitted near the position where the short-circuit defect occurs is gradually darkened, rather than that the entire affected region does not emit light, so that no obvious dark spot is seen when observed with the naked eye.

Returning to FIG. 2A, as shown in FIG. 2A, the two adjacent strip-shaped transparent conductive members 233 and the two adjacent transparent conductive blocks 234 define a gap G1. There is a width (or called as a first interval) W5 between the two adjacent strip-shaped transparent conductive members 233. The first interval W5 is preferably not greater than 30 microns. A ratio of the first interval W5 of the gap G1 in the first direction D1 to the second width W1 of each of the strip-shaped transparent conductive members 233 may be in a range of 1:2 to 1:4. The second width W1 is preferably not less than the first interval W5. In some embodiments, the first interval W5 is in a range of 5 to 25 microns, such as 10 microns, 15 microns, or 20 microns. In addition, the transparent conductive blocks 234 located at two opposite sides of the strip-shaped transparent conductive member 233 are staggered from each other in the first direction D1. Further, in the region occupied by the delocalizer 230, all the strip-shaped transparent conductive members 233, the area of the transparent conductive blocks 234, and the area of the gap G1 is 100%, and have a first sum of area. All the strip-shaped transparent conductive members 233 and the transparent conductive blocks 234 have a second sum of area. A ratio of the second sum of area to the first sum of area may be in a range of 50% to 80%, and for example, may be 60%, 65%, 70% or 75%.

Figure 2D:
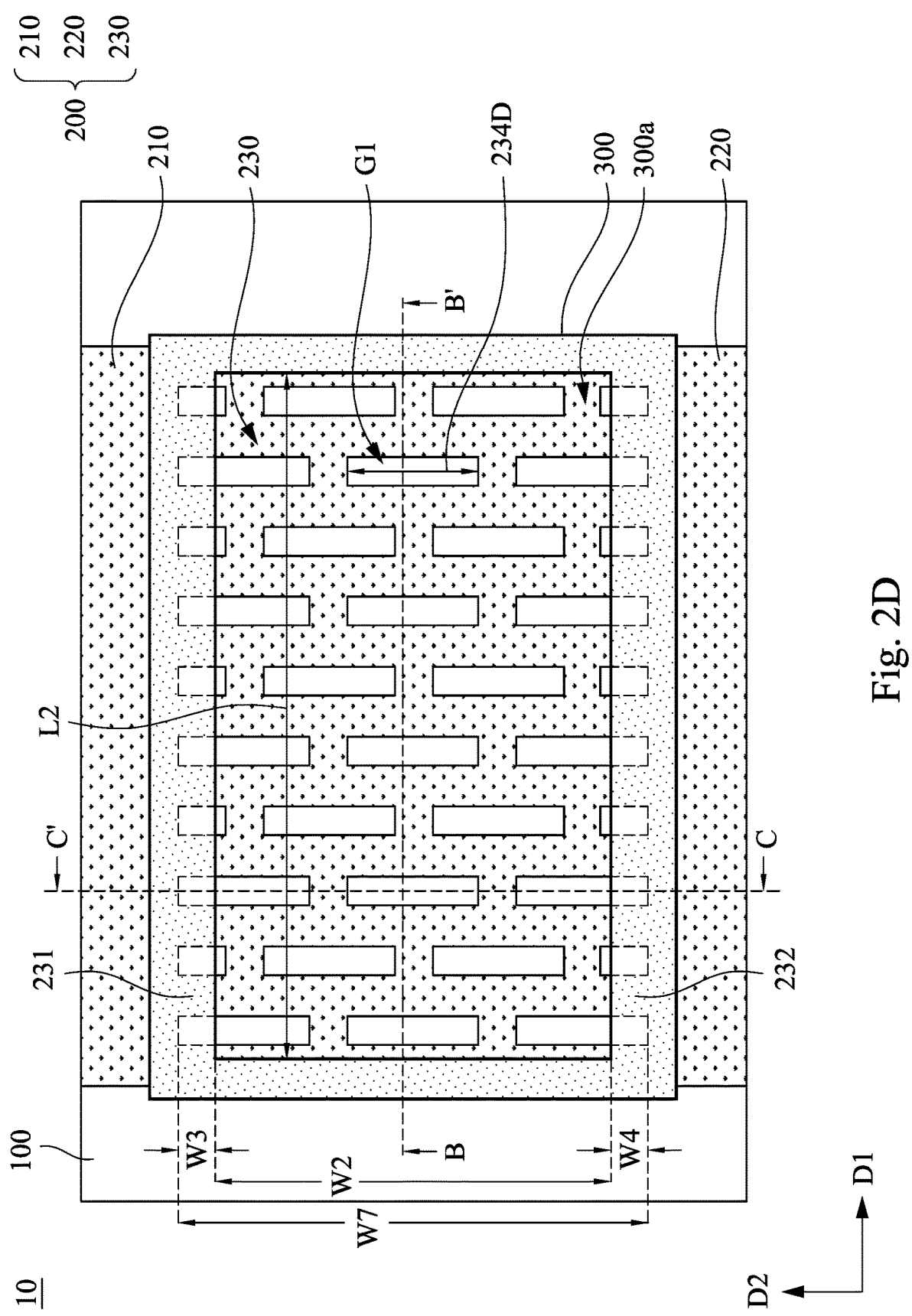
FIG. 2D is a top view of a light emitting device according to an embodiment of the disclosure.

In order to explain the relationship between the insulating layer 300 and the first electrode layer 200 in detail, please refer to FIG. 2D. As shown in FIG. 2D, the light emitting device of the present disclosure may further include an insulating layer 300 covering a first portion 231 of the delocalizer 230 of the first electrode layer 200 adjacent to the first contact pad 210 and a second portion 232 thereof adjacent to the second contact pad 220. The first portion 231 of the delocalizer 230 has a width W3 in the second direction D2, and the second portion 232 of the delocalizer 230 has a width W4 in the second direction D2. As shown in FIG. 2D, the insulating layer 300 may further have an opening 300a. The opening 300a is rectangle-shaped and has a first width W2 between the first contact pad 210 and the second contact pad 220. The opening 300a may have a first length L2 not less than the first width W2. Sum of the first width W2 of the opening 300a in the second direction D2, the width W3 of the first portion 231 and the width W4 of the second portion 232 is equal to a width W7 of the delocalizer 230 (i.e., the first width W2+the width W3+the width W4=the width W7). In some embodiments, the first width W3 and the second width W4 are less than the length 234D of the gap G1 in the second direction D2. Preferably, in one embodiment, the first width W3 and the second width W4 are in a range of 200 to 1000 microns, such as 400 microns, 600 microns, or 800 microns.

The delocalizer 230 has a first portion 231 adjacent to the first contact pad 210 and has a second portion 232 adjacent to the second contact pad 220, The first and the second portions 231, 232 are covered by the insulating layer 300 to provide a specific technical effect. Specifically, since the first portion 231 and the second portion 232 of the delocalizer 230 are covered by the insulating layer 300, when the organic light emitting layer 400 is formed, the organic light emitting layer 400 is only filled in the opening 300a of the insulating layer 300 and is not formed over the first portion 231 and the second portion 232 of the delocalizer 230. Accordingly, serious problems (e.g., the entire organic light emitting layer 400 may not emit light) that may be caused when the short-circuit defect occurs at the first portion 231 and the second portion 232 of the delocalizer 230 are avoided.

As shown in FIG. 2D, the opening 300a of the insulating layer 300 has a first length L2 in the first direction D1. In some embodiments, the first length L2 is greater than the first width W2 of the opening 300a in the second direction D2.

The organic light emitting layer 400 is filled in the opening 300a of the insulating layer 300 and covers an exposed portion of the delocalizer 230. Specifically, as shown in FIGS. 2B and 2C, an upper surface of the organic light emitting layer 400 is higher than an upper surface of the insulating layer 300, and the organic light emitting layer 400 covers a portion of the insulating layer 300. It should be noted that although the organic light emitting layer 400 illustrated in FIGS. 2B and 2C is a single layer structure, it should be understood that the organic light emitting layer 400 may have a multilayer structure including, for example, a hole injection layer (HIL), a hole transport layer (HTL), an emissive layer (EML), an electron transport layer (ETL), an electron injection layer (EIL), and the like. The material of the organic light emitting layer 400 may be any material known in the art suitable for the hole injection layer, the hole transport layer, the emissive layer, the electron transport layer, or the electron injection layer.

The second electrode layer 500 is disposed over the organic light emitting layer 400. Specifically, as shown in FIG. 2B, in the first direction D1, the second electrode layer 500 covers the organic light emitting layer 400 and the insulating layer 300. As shown in FIG. 2C, in the second direction D2, a sidewall of the second electrode layer 500 is aligned with a sidewall of the organic light emitting layer 400. However, it should be understood that in other embodiments, the sidewall of the second electrode layer 500 may not be aligned with the sidewall of the organic light emitting layer 400. In some embodiments, the second electrode layer 500 includes a metal, such as copper, silver, gold or aluminum, but is not limited thereto.

The conductive layer 600 is disposed over the first contact pad 210 and the second contact pad 220 of the first electrode layer 200. In some embodiments, the conductive layer 600 is a metal paste layer, such as a silver paste layer, a molybdenum aluminum molybdenum layer or metal layers, etc., but is not limited thereto. The first contact pad and the second contact pad have a current path therebetween. The current path has impedance. The impedance in the current path between the first contact pad 210 and the second contact pad 220 can be reduced by disposing the conductive layer 600 over the first contact pad 210 and the second contact pad 220.

Figure 4:
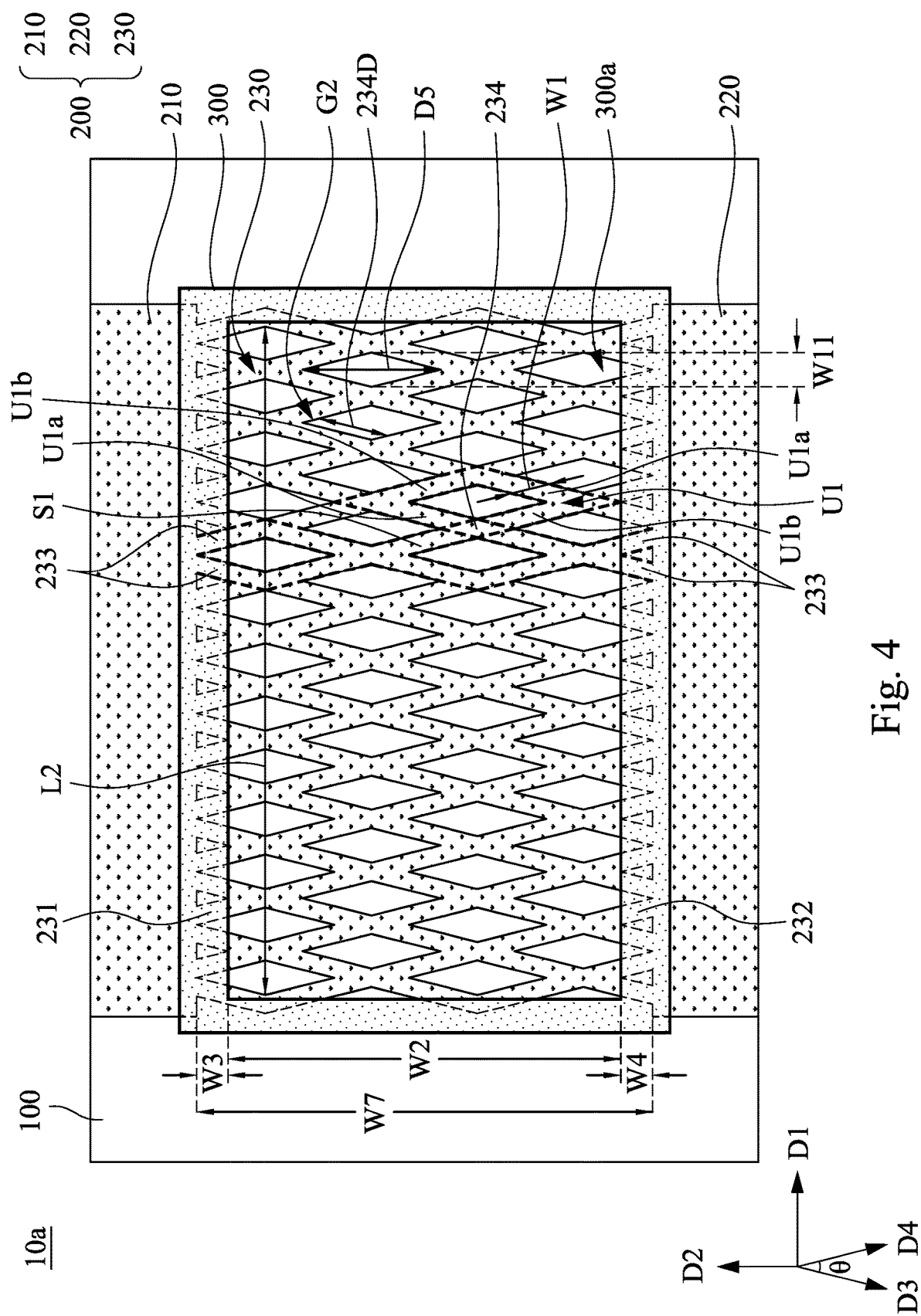
FIG. 4 is a top view of a light emitting device according to another embodiment of the disclosure.

FIG. 4 is a top view of a light emitting device 10a according to another embodiment of the disclosure. It is noted that as shown in FIG. 4, the same or similar elements as those in FIGS. 2A and 2D are given the same reference numerals, and the description thereof is omitted. Further, for the sake of clarity, the organic light emitting layer 400, the second electrode layer 500, and the conductive layer 600 are omitted in FIG. 4. Referring to FIG. 4, each of the strip-shaped transparent conductive members 233 between the first contact pad 210 and the second contact pad 220 has at least one closed loop U1. The closed loops U1 may be electrically connected to each other. Therefore, in one embodiment, each of the strip-shaped transparent conductive members 233 is "8-shaped" in a top view. Each of the closed loops U1 is a closed geometric pattern and is constituted by first conductive strips U1a and second conductive strips U1b of each of the strip-shaped transparent conductive members 233. The closed loop U1 may be diamond-shaped and is constituted by two first conductive strips U1a and two second conductive strips U1b. As shown in FIG. 4, each of the first conductive strips U1a extends along a third direction D3, and each of the second conductive strips U1b extends along a fourth direction D4. An included angle θ between the third direction D3 and the fourth direction D4 is less than 90°.

Specifically, the two adjacent first conductive strips U1a and the two adjacent second conductive strips U1b define a diamond-shaped gap G2. There is a distance 234D between two opposite sides of the diamond-shaped gap G2. The distance 234D is about 10 times or more of a second width W1 of the strip-shaped transparent conductive member 233, more preferably about 10 times to about 100 times. Accordingly, a section S1 defined by the two adjacent transparent conductive blocks 234 has a resistance value that can prevent the short-circuit defect. In addition, the diamond-shaped gap G2 has a second width W11 in the first direction D1 and a length D5 in the second direction D2. A ratio of the second width W11 to the second width W1 of the strip-shaped transparent conductive member 233 is in a range of 1:2 to 1:4. The first portion 231 and the second portion 232 of the delocalizer 230 covered by the insulating layer 300 have a width W3 and a width W4, respectively, in the second direction D2, and the width W3 and the width W4 are smaller than a length D5 of the diamond-shaped gap G2.

Figure 5A:
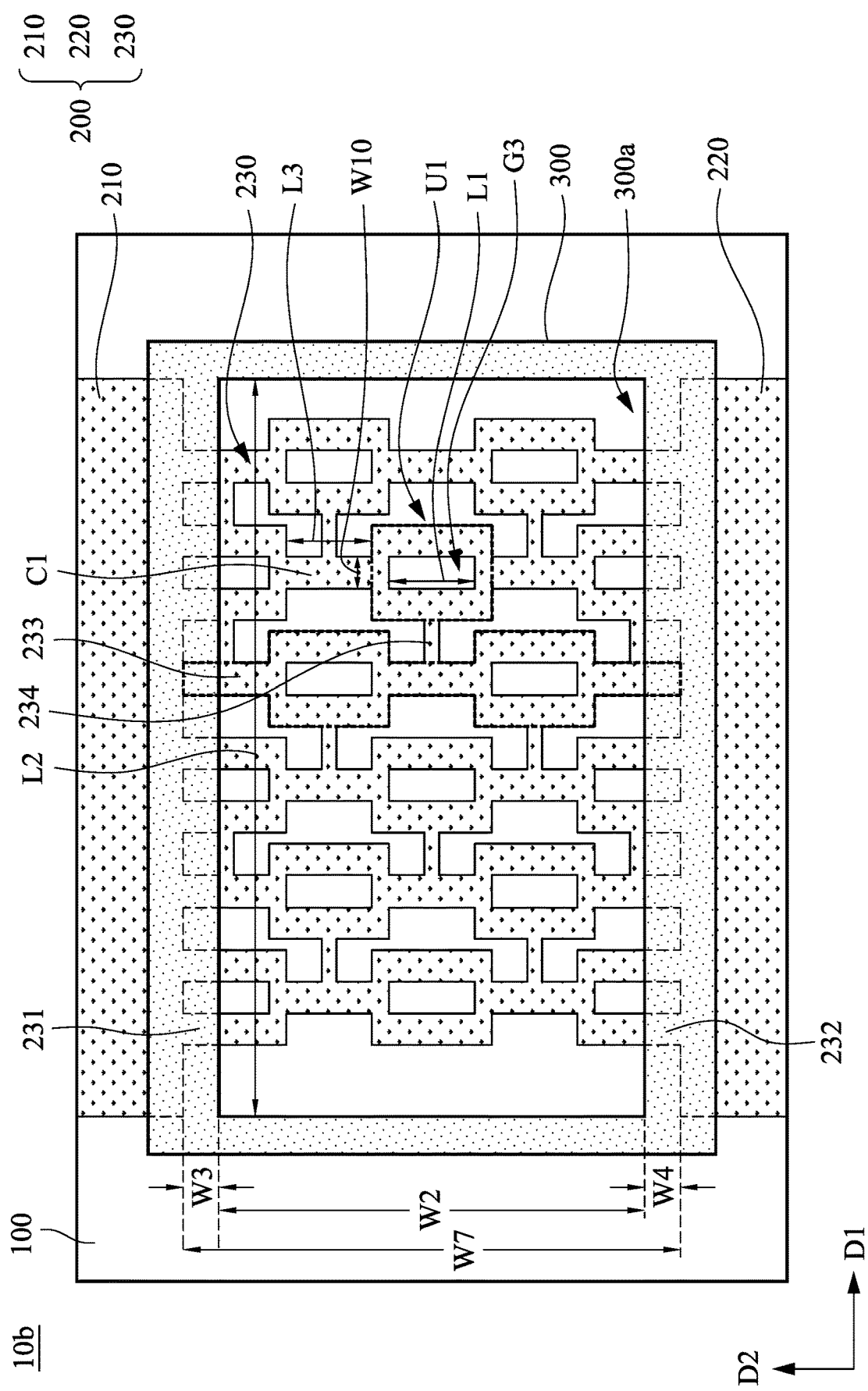
FIG. 5A is a top view of a light emitting device according to another embodiment of the disclosure.

FIG. 5A is a top view of a light emitting device 10b according to another embodiment of the disclosure. As shown in FIG. 5A, the light emitting device 10b includes a substrate 100, a first electrode layer 200, an insulating layer 300, an organic light emitting layer, a second electrode layer, and a conductive layer. It should be noted that, for the sake of clarity, the organic light emitting layer, the second electrode layer, and the conductive layer are omitted in FIG. 5A.

The first electrode layer 200 is disposed over the substrate 100 and includes a first contact pad 210, a second contact pad 220, and a delocalizer 230. Specifically, the first contact pad 210 and the second contact pad 220 extend along a first direction D1. The delocalizer 230 is disposed between the first contact pad 210 and the second contact pad 220. More specifically, the delocalizer 230 includes a plurality of strip-shaped transparent conductive members 233 and a plurality of transparent conductive blocks 234.

Figure 5B:
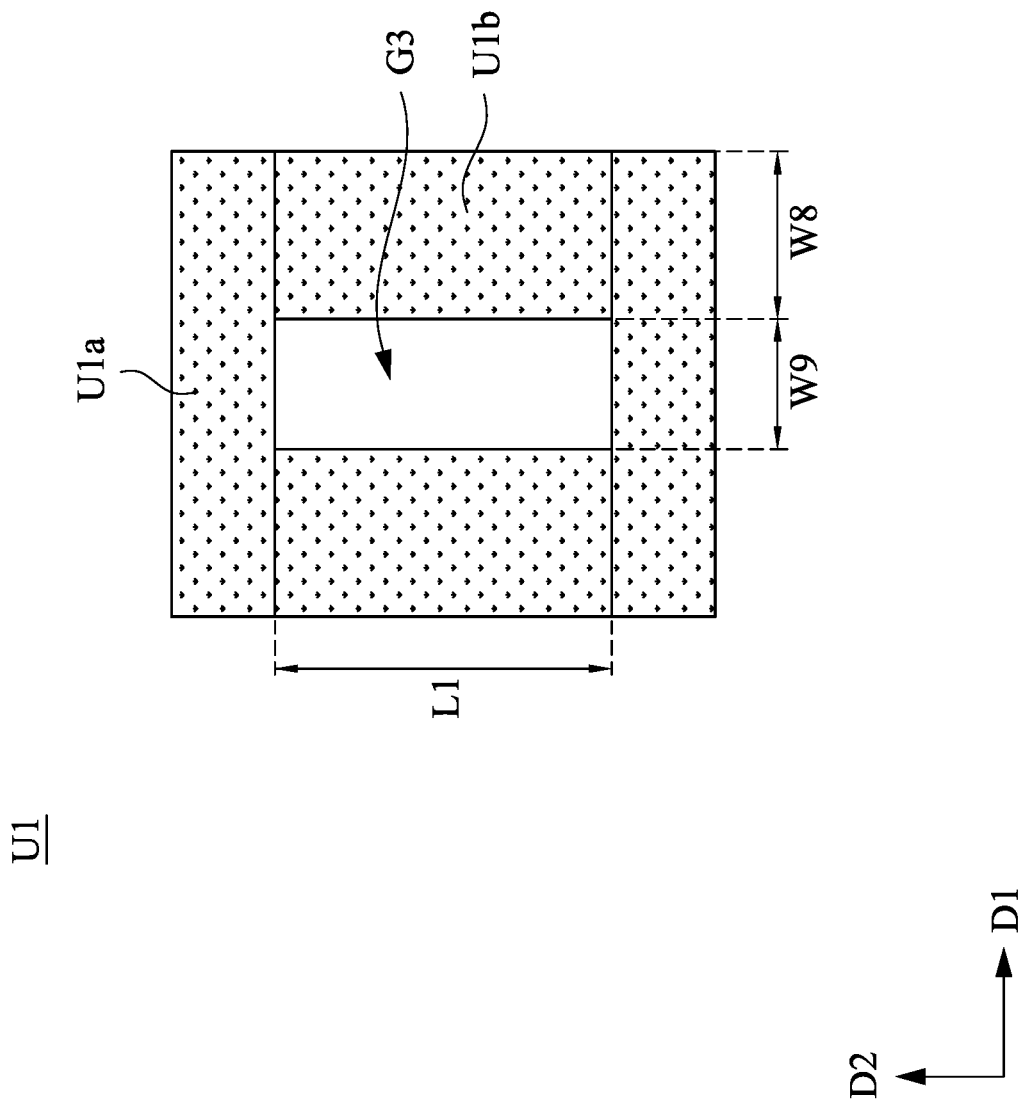
FIG. 5B is a partially enlarged view of a closed loop according to an embodiment of the disclosure.

Referring to FIG. 5A, each of the strip-shaped transparent conductive members 233 between the first contact pad 210 and the second contact pad 220 has at least one closed loop U1. Each of the closed loops U1 is a closed geometric pattern and is constituted by a plurality of conductive strips of the strip-shaped transparent conductive member 233. One of the closed loops U1 is connected to at least one of the transparent conductive blocks 234. Referring to FIG. 5B, FIG. 5B is a partially enlarged view of a closed loop U1. As shown in FIG. 5B, the closed loop U1 is constituted by two first conductive strips U1a and two second conductive strips U1b. Each of the first conductive strips U1a extends along a first direction D1, and each of the second conductive strips U1b extends along a second direction D2. The second direction D2 is perpendicular to the first direction D1.

The second conductive strip U1b has a length L1 and a width W8, and the length L1 is about 10 times or more of the width W8, more preferably about 10 times to about 100 times. Accordingly, the second conductive strip U1b has a resistance value that can prevent the short-circuit defect. The two first conductive strips U1a and the two second conductive strips U1b define a gap G3. The gap G3 has a width W9 in the first direction D1 and a length L1 in the second direction D2. A ratio of the width W9 of the gap G3 to the width W8 of the second conductive strip U1b is in a range of 1:2 to 1:4.

As shown in FIG. 5A, the strip-shaped transparent conductive members 233 extend from the first contact pad 210 to the second contact pad 220, and the strip-shaped transparent conductive members 233 are connected to each other by at least one transparent conductive block 234.

Each of the strip-shaped transparent conductive members 233 has a connecting portion C1 between the two adjacent closed loops U1. Specifically, the connecting portion C1 has a length L3 in the second direction D2 and a second width W10 in the first direction D1, and the length L3 is about 10 times or more of the second width W10, more preferably about 10 times to about 100 times. Given the above, the connecting portion C1 has a resistance value that can prevent the short-circuit defect.

The insulating layer 300 covers a portion of the first electrode layer 200 and has an opening 300a exposing the delocalizer 230. Specifically, the insulating layer 300 covers a first portion 231 of the delocalizer 230 adjacent to the first contact pad 210 and a second portion 232 thereof adjacent to the second contact pad 220. The first portion 231 of the delocalizer 230 has a width W3 in the second direction D2, and the second portion 232 of the delocalizer 230 has a width W4 in the second direction D2. As shown in FIG. 5A, sum of the first width W2 of the opening 300a in the second direction D2, the width W3 of the first portion 231 and the width W4 of the second portion 232 is equal to a width W7 of the delocalizer 230 (i.e., the first width W2+the width W3+the width W4=the width W7). In some embodiments, the first width W3 and the second width W4 are less than the length L1 of the gap G3 in the second direction D2.

As shown in FIG. 5A, the opening 300a of the insulating layer 300 has a first length L2 in the first direction D1. In some embodiments, the first length L2 is greater than the first width W2 of the opening 300a in the second direction D2.

The organic light emitting layer is filled in the opening 300a and covers an exposed portion of the delocalizer 230. The second electrode layer is disposed over the organic light emitting layer. The conductive layer is disposed over the first contact pad 210 and the second contact pad 220 of the first electrode layer 200. Details of the organic light emitting layer, the second electrode layer, and the conductive layer can be referred to FIG. 2B, FIG. 2C and the corresponding related paragraphs.

In summary, compared with the conventional light emitting device, the light emitting device of the present disclosure has a smaller region affected by the short-circuit defect, and the naked eye is not easy to find it, and normal operation of the entire light emitting device is not affected. Moreover, the affected region is gradually darkened, so that when observed with the naked eye, no obvious dark spot is seen. In addition, the light emitting device of the present disclosure does not have a grid-shaped auxiliary electrode compared with the conventional light emitting device. Therefore, the manufacturing cost is lower, and it is similar to a mirror, and the emitting light is uniform rather than grid-like, so that it has better applicability. Furthermore, the light emitting device of the present disclosure does not have the grid-shaped auxiliary electrode, and thus there is no serious short-circuit problem that the insulating layer is burned through so that the entire light emitting device does not emit light.

While the disclosure has been disclosed above in the embodiments, other embodiments are possible. Therefore, the spirit and scope of the claims are not limited to the description included in the embodiments herein.

It is apparent to those skilled in the art that various alterations and modifications can be made without departing from the spirit and scope of the disclosure, and the scope of the disclosure is defined by the scope of the appended claims.

What is claimed is:

1. A light emitting device comprising:
an organic light emitting layer;
a first electrode layer comprising a first contact pad and a transparent conductive structure for the organic light emitting layer, wherein the transparent conductive structure comprises a plurality of strip-shaped transparent conductive members adjacent to each other,
wherein the strip-shaped transparent conductive members extend from the first contact pad;
wherein two of the strip-shaped transparent conductive members are separated by a first interval; and
wherein each of the two of the strip-shaped transparent conductive members has a width not less than the first interval, and the width is in a range of 10 to 50 microns;
a second electrode layer disposed over the organic light emitting layer; and
an insulating layer covering the transparent conductive structure, wherein the organic light emitting layer portionally covers the insulating layer.

2. The light emitting device of claim 1, wherein the transparent conductive structure has a first portion adjacent to the first contact pad, and wherein the first portion is covered by the insulating layer.

3. The light emitting device of claim 2, wherein the first portion of the transparent conductive structure has a width in a range of 800 to 1000 microns.

4. The light emitting device of claim 1, further comprising a second contact pad, wherein the strip-shaped transparent conductive members are connected in series and are between the first contact pad and the second contact pad.

5. The light emitting device of claim 1, wherein the strip-shaped transparent conductive members are made of indium tin oxide or indium zinc oxide.

6. The light emitting device of claim 1, wherein each of the two of the strip-shaped transparent conductive members has the width being 15 microns, 20 microns or 30 microns.

7. The light emitting device of claim 1, wherein the first interval is not greater than 30 microns.

8. The light emitting device of claim 1, further comprising a plurality of transparent conductive blocks adjacent to each other and electrically connected between adjacent two of the strip-shaped transparent conductive members.

9. The light emitting device of claim 2, wherein the insulating layer partially covers the first contact pad.

10. A delocalizer for delocalizing a dark spot of a light emitting region of an organic light emitting layer, the delocalizer comprising:
a plurality of strip-shaped transparent conductive members adjacent to each other,
wherein the adjacent two of the strip-shaped transparent conductive members are separated by a first interval; and
wherein each of the strip-shaped transparent conductive members has a width not less than the first interval, and the width is in a range of 10 to 50 microns;
a plurality of transparent conductive blocks adjacent to each other and electrically connected between adjacent two of the strip-shaped transparent conductive members; and an insulating layer covering the transparent conductive structure, wherein the organic light emitting layer portionally covers the insulating layer.

11. The delocalizer of claim 10, wherein each of the strip-shaped transparent conductive members has the width being 15 microns, 20 microns or 30 microns.

12. The delocalizer of claim 11, wherein a ratio of the first interval to the width of each of the strip-shaped transparent conductive members is in a range of 1:2 to 1:4.

13. The delocalizer of claim 11, wherein adjacent two of the transparent conductive blocks are separated by a second interval, and the second interval is about 10 times or more of the width of each of the strip-shaped transparent conductive members.

14. The delocalizer of claim 11, wherein the first interval is not greater than 30 microns.

15. The delocalizer of claim 10, wherein a short-circuit defect occurs at the light emitting region, and wherein the light emitting region has a light emitted near the short-circuit defect, and wherein the delocalizer is configured to delocalize the dark spot by gradually weakening the emitted light near the short-circuit defect, so that the dark spot cannot be observed with naked eyes.

16. The delocalizer of claim 10, wherein the transparent conductive blocks electrically connected to two opposite sides of each of the strip-shaped transparent conductive members are staggered from each other in one direction.

17. The delocalizer of claim 10, wherein the strip-shaped transparent conductive members and the transparent conductive blocks define a plurality of gaps, and wherein the strip-shaped transparent conductive members, the transparent conductive blocks, and the gaps have a first sum of area, the strip-shaped transparent conductive members and the transparent conductive blocks has a second sum of area, and wherein a ratio of the second sum of area to the first sum of area is in a range of 50% to 80%.

18. A light emitting device using the delocalizer of claim 10 comprising the organic light emitting layer, the light emitting device further comprising a second electrode layer disposed over the organic light emitting layer,
wherein the insulating layer covers the delocalizer and has an opening,
wherein the organic light emitting layer is filled in the opening,
and wherein the organic light emitting layer portionally covers the insulating layer.

19. The light emitting device of claim 18, further comprising a first contact pad and a second contact pad, wherein the strip-shaped transparent conductive members are connected in series and are between the first contact pad and the second contact pad.

* * * * *